(12) United States Patent
Jang et al.

(10) Patent No.: US 9,989,855 B2
(45) Date of Patent: Jun. 5, 2018

(54) CHEMICAL SUPPLY UNIT CAPABLE OF AUTOMATICALLY REPLACING A CANISTER AND A SUBSTRATE TREATMENT APPARATUS HAVING THE SAME

(71) Applicant: SAMSUNG ELECTRONICS CO., LTD., Suwon-si, Gyeonggi-do (KR)

(72) Inventors: Sungmin Jang, Suwon-si (KR); Su-Hwan Kim, Suwon-si (KR); Dai-Hee Lee, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days. days.

(21) Appl. No.: 15/401,800

(22) Filed: Jan. 9, 2017

(65) Prior Publication Data

US 2017/0242340 A1 Aug. 24, 2017

(30) Foreign Application Priority Data

Feb. 18, 2016 (KR) ........................ 10-2016-0019313

(51) Int. Cl.
*H01L 21/027* (2006.01)
*B25J 11/00* (2006.01)
(Continued)

(52) U.S. Cl.
CPC ............ *G03F 7/16* (2013.01); *H01L 21/0274* (2013.01); *H01L 21/6715* (2013.01); *H01L 21/67017* (2013.01); *H01L 21/6719* (2013.01); *B65D 47/04* (2013.01); *B67D 1/0829* (2013.01); *B67D 7/0272* (2013.01); *B67D 7/0283* (2013.01); *B67D 7/0288* (2013.01); *B67D 7/84* (2013.01); *F17C 13/08* (2013.01)

(58) Field of Classification Search
None
See application file for complete search history.

(56) References Cited

U.S. PATENT DOCUMENTS 5,102,010 A * 4/1992 Osgar ................... B65D 47/36
222/1
6,769,576 B2 8/2004 Ichikawa
(Continued)

FOREIGN PATENT DOCUMENTS

JP 09-020359 1/1997
JP 2015-076472 4/2015
(Continued)

*Primary Examiner* — Binu Thomas
(74) *Attorney, Agent, or Firm* — F. Chau & Associates, LLC

(57) ABSTRACT

A substrate treatment apparatus includes a substrate treatment unit configured to provide a chemical solution to a substrate to treat the substrate, and a chemical supply unit configured to supply the chemical solution to the substrate treatment unit. The chemical supply unit includes a loader configured to load a canister containing the chemical solution to the chemical supply unit, a clamp configured to clamp the canister in place, a chemical supply line through which the chemical solution is supplied to the substrate treatment unit, and a coupler configured to couple the chemical supply line to the canister. The chemical supply unit is capable of automatically replacing the canister and the substrate.

8 Claims, 17 Drawing Sheets

(51) Int. Cl.

| | | |
|---|---|---|
| *F17C 13/08* | (2006.01) | |
| *G03F 7/16* | (2006.01) | |
| *B67D 7/84* | (2010.01) | |
| *H01L 21/67* | (2006.01) | |
| *B67D 7/02* | (2010.01) | |
| *B65D 47/04* | (2006.01) | |
| *B67D 1/08* | (2006.01) | |

(56) References Cited

U.S. PATENT DOCUMENTS

2015/0078870 A1\*  3/2015  Dauendorffer ......... B65D 47/04
                                                                                414/589
2015/0096682 A1    4/2015  Nakashima

FOREIGN PATENT DOCUMENTS

| KR | 10-2001-0053914 | 7/2001 |
| KR | 10-2007-0066627 | 6/2007 |
| KR | 10-2009-0029393 | 3/2009 |
| KR | 10-2009-0079410 | 7/2009 |
| KR | 10-0938240 | 1/2010 |
| KR | 10-1403510 | 6/2014 |
| KR | 10-2015-0018453 | 2/2015 |
| KR | 10-2015-0041587 | 4/2015 |
| KR | 10-1517033 | 5/2015 |
| KR | 10-1535870 | 7/2015 |

\* cited by examiner

CHEMICAL SUPPLY UNIT CAPABLE OF AUTOMATICALLY REPLACING A CANISTER AND A SUBSTRATE TREATMENT APPARATUS HAVING THE SAME

CROSS-REFERENCE TO RELATED APPLICATION(S)

This U.S. nonprovisional patent application claims priority under 35 U.S.C. § 119 to Korean Patent Application 10-2016-0019313, filed on Feb. 18, 2016, in the Korean Intellectual Property Office, the disclosure of which is incorporated by reference herein in its entirety.

TECHNICAL FIELD

The present inventive concept relates to a chemical supply unit and a substrate treatment apparatus having the same and, more particularly, to a chemical supply unit capable of automatically replacing a canister and a substrate treatment apparatus having the same.

DISCUSSION OF THE RELATED ART

In a semiconductor fabrication process, a coating process may be performed to coat a chemical solution on a substrate. The chemical solution may be used to form a desirable pattern on the substrate. The chemical solution may include, for example, a photoresist. To supply the chemical solution, tasks such as replacing a canister that contains the chemical solution, opening an injection port of the canister, connecting a chemical supply line to the injection port, and the like, are manually performed by a technician. When performing such tasks, the technician may be directly exposed to the chemical solution.

SUMMARY

Exemplary embodiments of the present inventive concept provide a chemical supply unit and a substrate treatment apparatus having the same capable of automatically replacing and supplying a chemical solution.

According to an exemplary embodiment of the present inventive concept, a substrate treatment apparatus includes a substrate treatment unit configured to provide a chemical solution to a substrate to treat the substrate, and a chemical supply unit configured to supply the chemical solution to the substrate treatment unit. The chemical supply unit includes a loader configured to load a canister containing the chemical solution to the chemical supply unit, a clamp configured to clamp the canister in place, a chemical supply line through which the chemical solution is supplied to the substrate treatment unit, and a coupler configured to couple the chemical supply line to the canister.

According to an exemplary embodiment of the present inventive concept, a chemical supply unit includes a loader that loads a canister including a chemical solution to the chemical supply unit, a clamp that clamps the canister loaded on the loader such that the canister cannot move relative to the loader, a chemical supply line that receives the chemical solution from the canister, an opener that opens and closes an injection port of the canister, and a coupler that couples the chemical supply line to the injection port of the canister.

According to an exemplary embodiment of the present inventive concept, a substrate treatment apparatus includes a chemical supply unit, a substrate treatment unit, and a chemical supply line connecting the chemical supply unit with the substrate treatment unit. The chemical supply unit is configured to receive a canister, store the canister within a housing of the chemical supply unit, clamp the canister, open the canister and couple a first end of the chemical supply line to the canister. The chemical supply unit is configured to provide a chemical substance stored in the canister to the substrate treatment unit through the chemical supply line. Within a housing of the substrate treatment unit, the chemical substance is output from a second end of the chemical supply line and contacts a substrate.

BRIEF DESCRIPTION OF THE DRAWINGS

The above and other features of the present inventive concept will become more apparent by describing in detail exemplary embodiments thereof in conjunction with the accompanying drawings, in which.

DETAILED DESCRIPTION OF THE EMBODIMENTS

Figure 1:
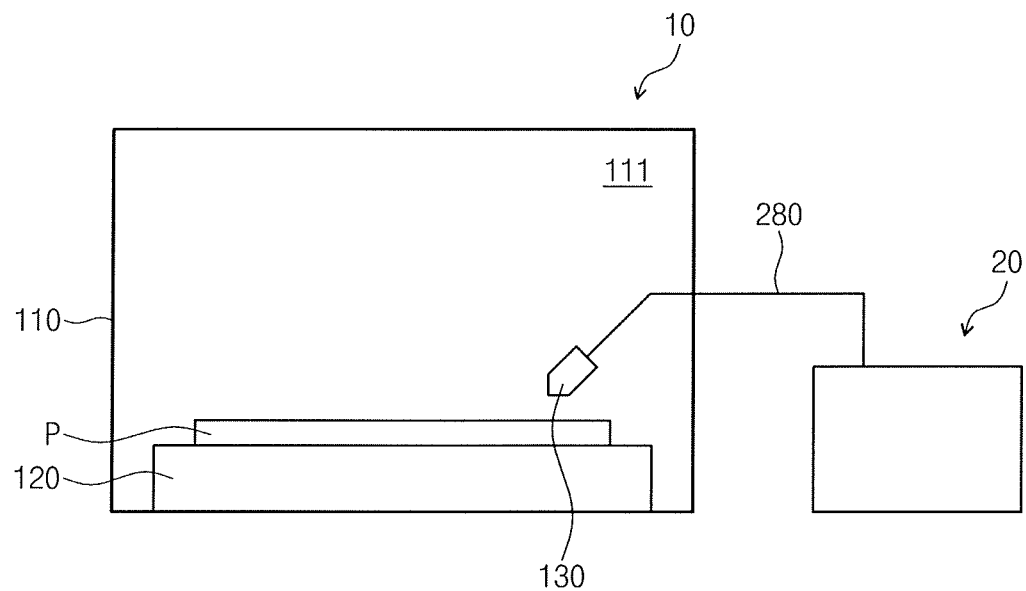
FIG. 1 is a diagram illustrating a substrate treatment apparatus according to an exemplary embodiment of the present inventive concept.

Exemplary embodiments of the present inventive concept will now be described more fully hereinafter with reference to the accompanying drawings. The present inventive concept may, however, be embodied in different forms and should not be construed as limited to the embodiments set forth herein. In the drawings, the sizes and relative sizes of layers and regions may be exaggerated for clarity.

As used herein, the singular forms "a," "an" and "the" are intended to include the plural forms as well, unless the context clearly indicates otherwise. It will be further understood that terms such as those defined in commonly used dictionaries should be interpreted as having a meaning that is consistent with their meaning in the context of the relevant art and will not be interpreted in an idealized or overly formal sense unless expressly so defined herein.

FIG. 1 is a diagram illustrating a substrate treatment apparatus 1 according to an exemplary embodiment of the present inventive concept. The substrate treatment apparatus 1 may include a substrate treatment unit 10 and a chemical supply unit 20. The substrate treatment unit 10 may treat a substrate P using a chemical solution supplied from the chemical supply unit 20. For example, the substrate treatment unit 10 may be configured to perform a photolithography process on the substrate P, and the chemical solution may include a photoresist. The substrate P may be included in a display device, for example, a liquid crystal display device. However, exemplary embodiments of the present inventive concept are not limited thereto.

The substrate treatment unit 10 may include a chamber 110, a substrate supporter 120, and a slit nozzle 130. The chamber 10 may have an inner space 111 in which a process is performed on the substrate P. The substrate P may be placed on the substrate supporter 120. The slit nozzle 130 may be disposed above the substrate supporter 120. The slit nozzle 130 may be shaped like a bar. The slit nozzle 130 may inject a chemical solution onto the substrate P. The slit nozzle 130 may be supplied with the chemical solution through a chemical supply line 280 of the chemical supply unit 20. Although not shown in the figures, the substrate treatment unit 10 may further include a driving unit that moves the slit nozzle 130 to different regions of the substrate P.

Figure 2A:
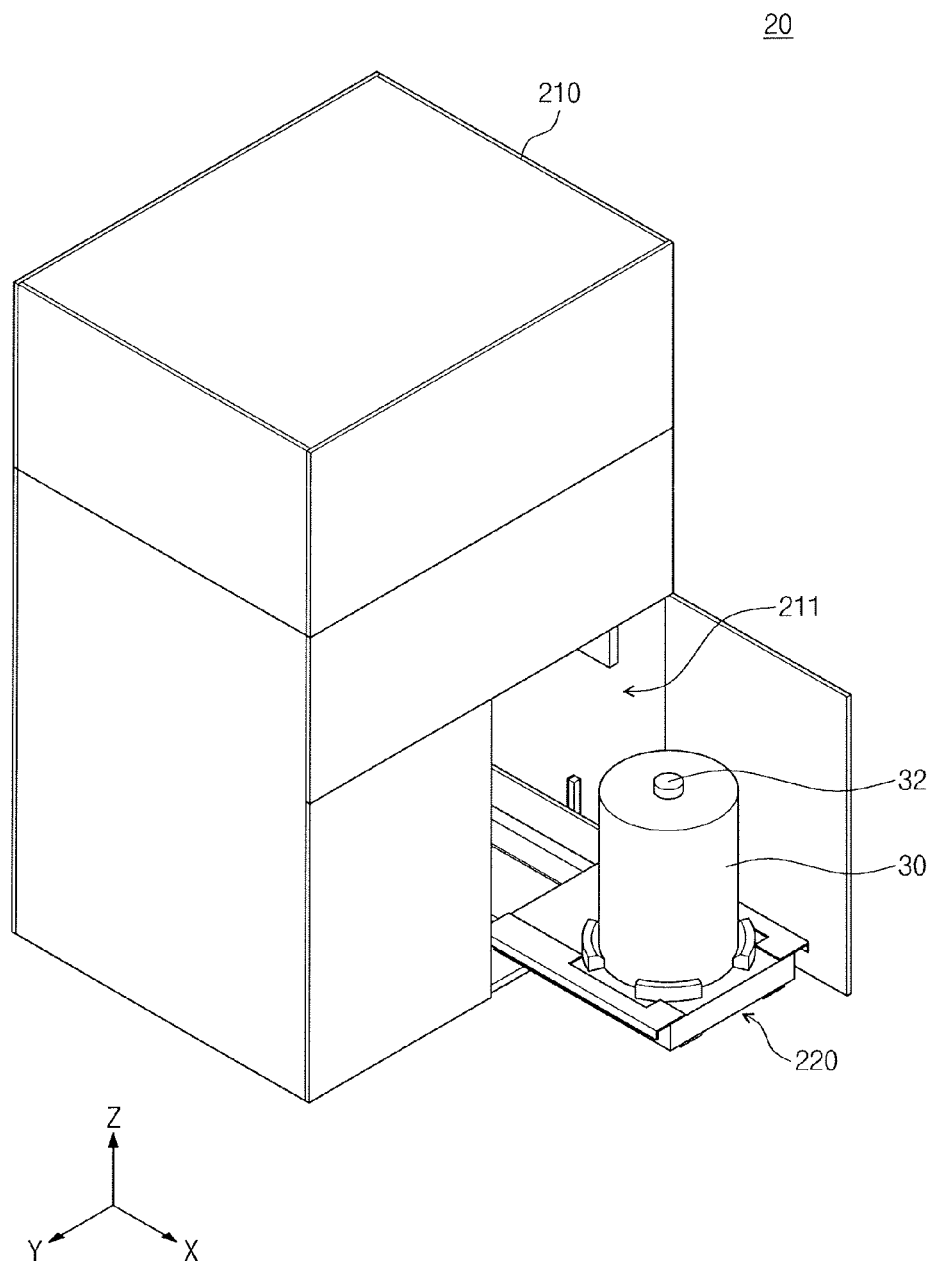
FIG. 2A is a perspective view illustrating a chemical supply unit of FIG. 1 according to an exemplary embodiment of the present inventive concept.
Figure 2B:
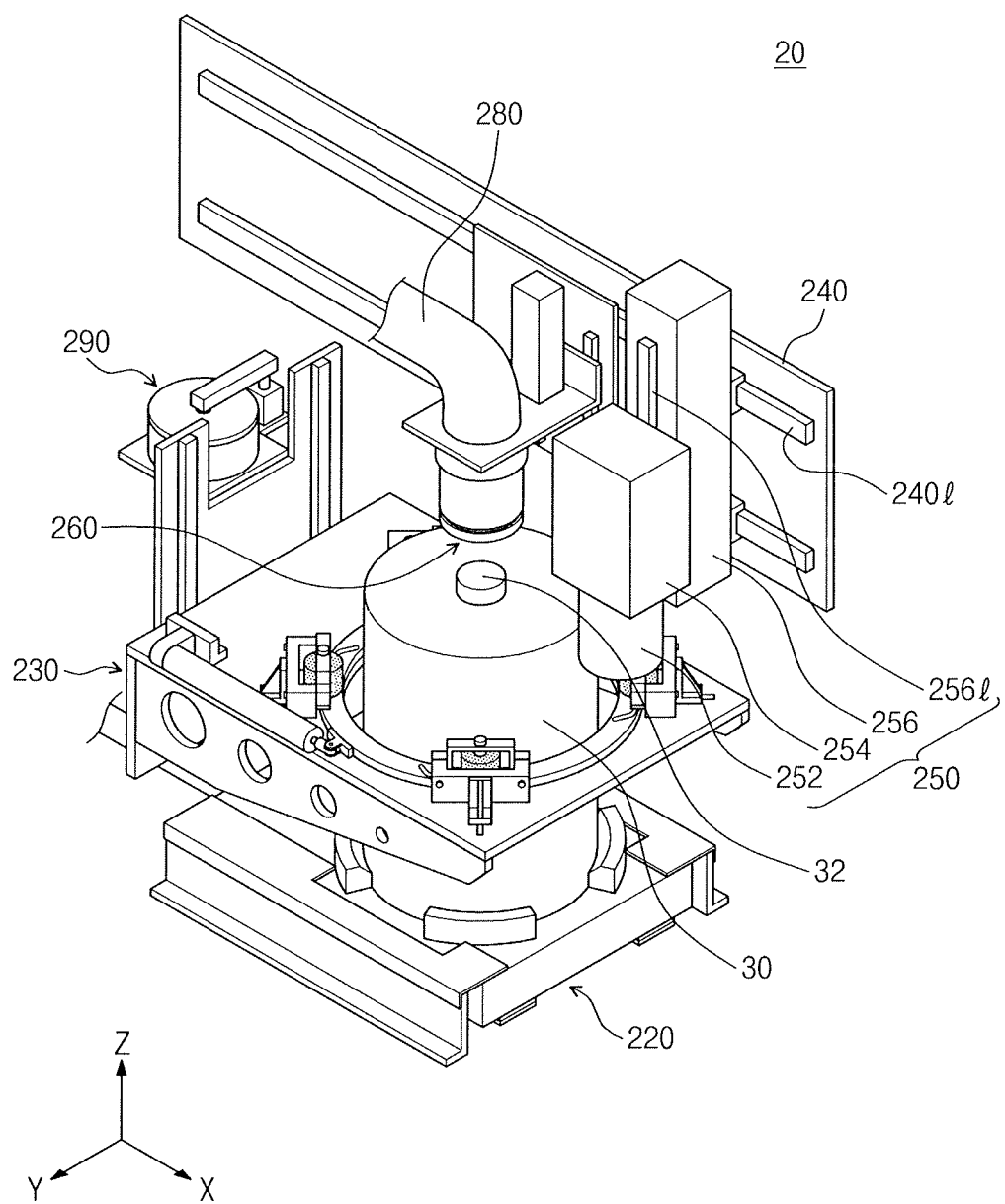
FIG. 2B is an enlarged perspective view of the chemical supply unit of FIG. 1 according to an exemplary embodiment of the present inventive concept.

FIG. 2A is a perspective view illustrating the chemical supply unit 20 of FIG. 1 according to an exemplary embodiment of the present inventive concept. FIG. 2B is an enlarged perspective view of the chemical supply unit 20 of FIG. 1 according to an exemplary embodiment of the present inventive concept. Referring to FIGS. 2A and 2B, the chemical supply unit 20 may include a housing 210, a loader 220, a clamp 230, a guide 240, an opener 250, a coupler 260, and a cleaning port 290, in addition to the chemical supply line 280. The chemical supply unit 20 may supply the chemical solution to the substrate treatment unit 10. A first direction X, a second direction Y perpendicular to the first direction X, and a third direction Z perpendicular to the first and second directions X and Y may be used when describing the substrate treatment apparatus 1.

The housing 210 may have a first space 211 in which a chemical supply process is performed. The directions X, Y and Z may be the Cartesian axes. The first space 211 may be designed to accommodate the loader 220, the clamp 230, the guide 240, the opener 250, the chemical supply line 280, the coupler 260, and the cleaning port 290. The housing 210 may be closed when the chemical supply process is performed.

Figure 3:
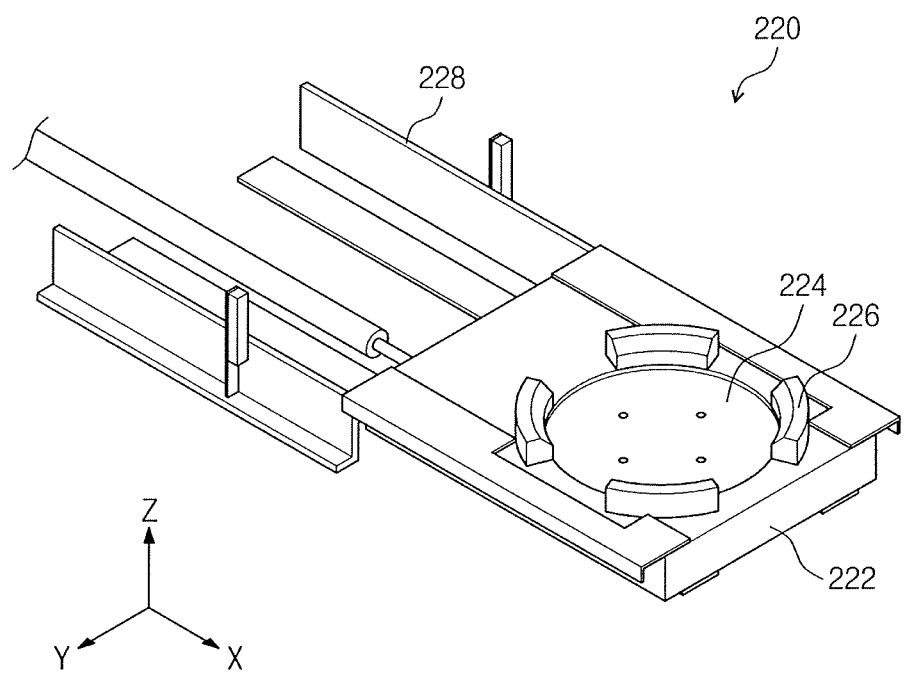
FIG. 3 is a perspective view illustrating a loader of FIG. 2B according to an exemplary embodiment of the present inventive concept.

FIG. 3 is a perspective view illustrating the loader 220 of FIG. 2B according to an exemplary embodiment of the present inventive concept. Referring to FIGS. 1 to 3, a canister 30 may be loaded onto and unload from the loader 220. The canister 30 may include the chemical solution that is injected on the substrate P. The loader 220 may include a first base 222, a plate 224, a canister holder 226, and a loader driving part 228. The plate 224 and the canister holder 226 may be disposed on the first base 222. The canister 30 may be loaded on the plate 224 and unloaded from the plate 224. Also, the plate 224 may be configured to rotate the canister 30. The plate 224 may have a top surface lower in elevation than a top surface of the first base 222. Since the plate 224 is disposed under the top surface of the first base 222, a portion of the chemical solution that may be leaked or spilled from the canister 30 may be collected on the plate 224. Accordingly, the leaked or spilled chemical solution might not spread to contaminate other parts of the loader 220. The canister holder 226 may be disposed in proximity to the plate 224. For example, the canister holder 226 may support a side of the canister 30 that is loaded on the plate 224.

The loader driving part 228 may drive (e.g., move) the first base 222 between a load position and a work position along the first directing X. For example, a location outside the housing 210 may correspond to the load position where the canister 30 is loaded on and unloaded from the first base 222, and the first space 211 of the housing 210 may correspond to the work position where the chemical supply process is conducted. Although not shown in the figures, the first base 222 may include an auxiliary wheel at its underside. The auxiliary wheel may assist movement of the first base 222.

Referring to FIG. 2A, the canister 30 may contain the chemical solution therein. The canister 30 may include an injection port 32 at its top end. The canister 30 may be loaded in a hermetically sealed state in which the injection port 32 is closed. For example, the injection port 32 may include a membrane that seals an interior of the canister 30. Although not shown in the figures, the injection port 32 may include a cover. The cover may be threaded on the injection port 32 to seal the canister 30, or the cover may be pressed on the injection port 32 to seal the canister 30. The injection port 32 may be variously configured to have alternative sealing structures or methods.

Figure 4:
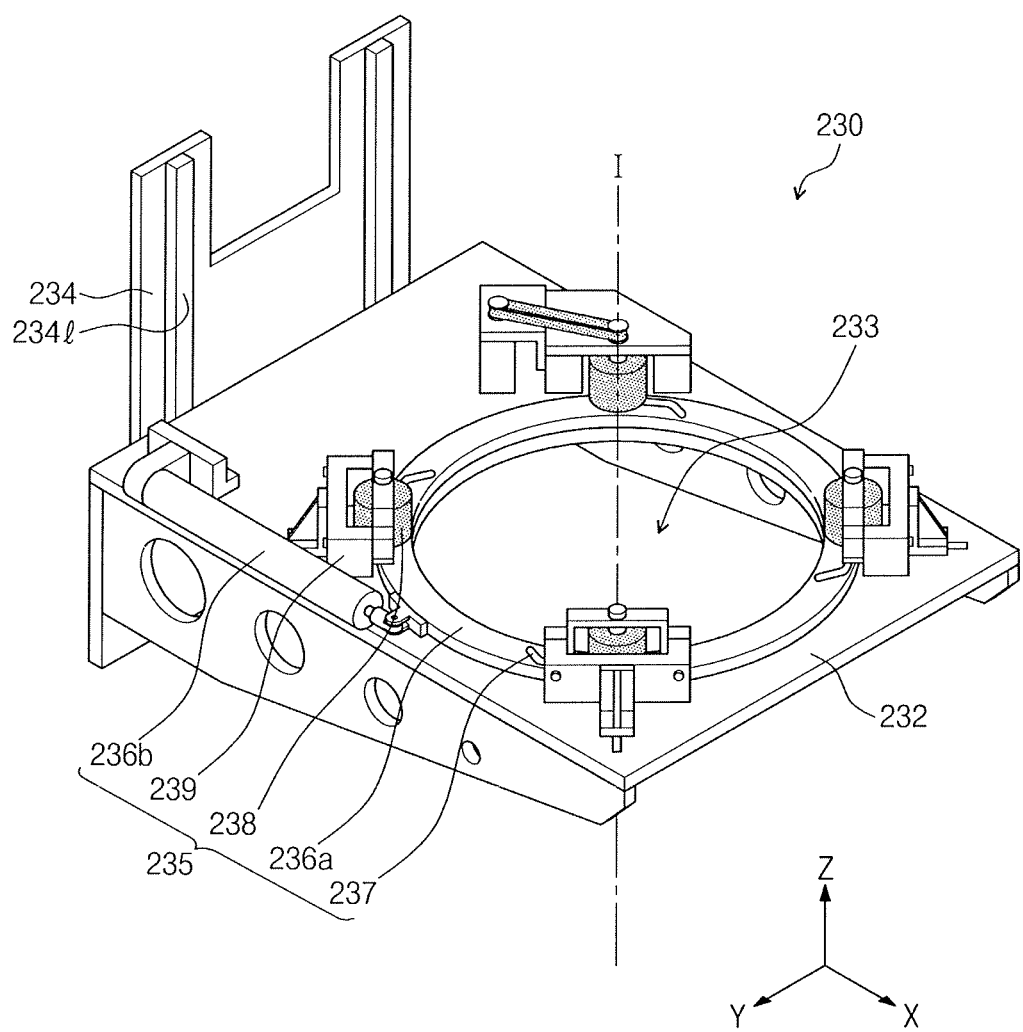
FIG. 4 is a perspective view illustrating a clamp of FIG. 2B according to an exemplary embodiment of the present inventive concept.
Figure 5A:
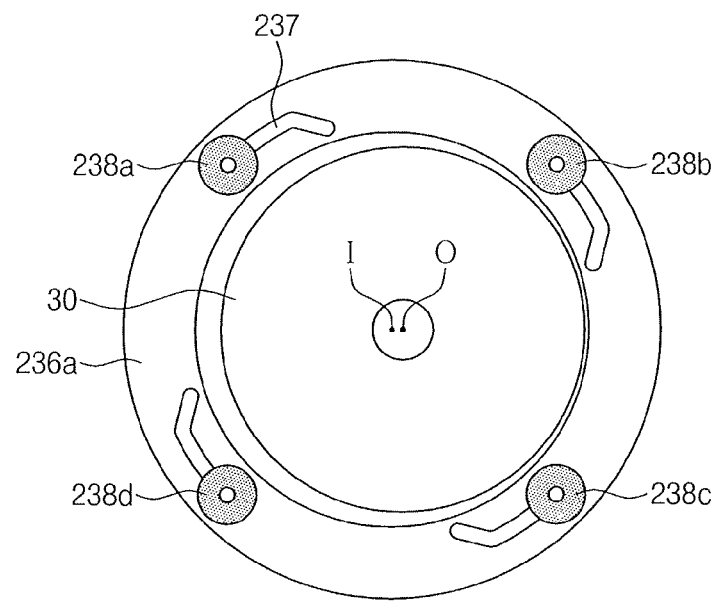
FIGS. 5A to 5C are plan views illustrating a movement of a holding member of FIG. 4 according to exemplary embodiments of the present inventive concept.
Figure 5B:
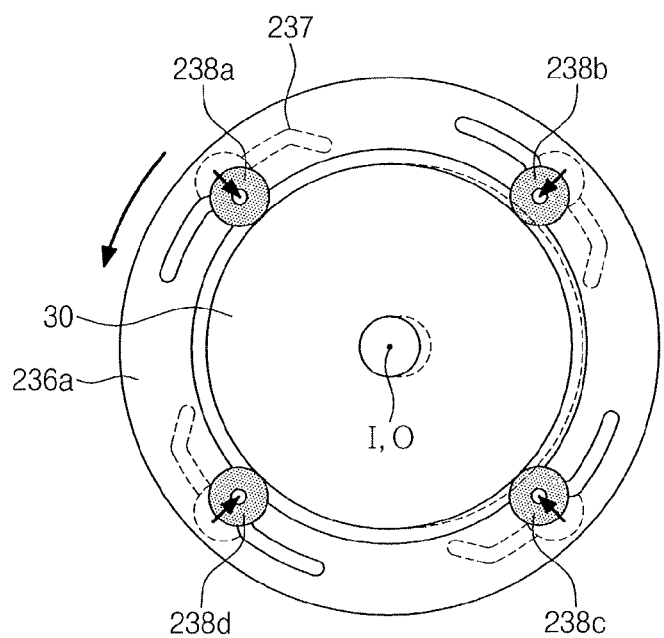
Figure 5C:
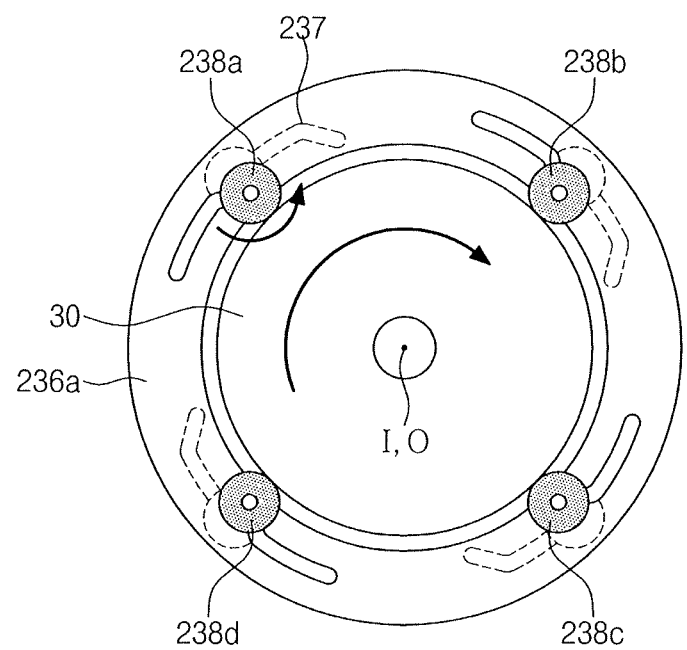

FIG. 4 is a perspective view illustrating the clamp 230 of FIG. 2B according to an exemplary embodiment of the present inventive concept. FIGS. 5A to 5C are plan views illustrating the movement of a holding member 235 of FIG. 4 according to exemplary embodiments of the present inventive concept. The clamp 230 may fixedly hold the canister 30 when the canister 30 is loaded on the loader 220. The clamp 230 may include, for example, a holder 238. The holder 238 may position or align the canister 30 at a central axis O of the canister 30. The central axis O of the canister 30 coincides with a preset central axis I of the coupler 260. Referring to FIGS. 4 to 5C, the clamp 230 may include a second base 232, a clamp guide 234, and a holding member 235. The second base 232 may be coupled to the clamp guide 234. The second base 232 may be configured to move along the clamp guide 234. For example, the second base 232 may shift in the third direction Z along a first guide rail 234l of the clamp guide 234. The holding member 235 may be disposed on the second base 232.

The holding member 235 may include a first frame 236a, a holder driving part 236b, a first holder guide 237, the holder 238, and a second holder guide 239. The first frame 236a may be shaped like a ring and may include a second space 233 thereinside. When the holder 238 is positioned at a locking position, the central axis O of the canister 30 may be coincident with the central axis I of the coupler 260. The canister 30 may be placed in the second space 233 of the first frame 236a. The holder driving part 236b may drive the first frame 236a to shift the holder 238 between the locking position and a standby position. For example, the locking position may be a position where the central axis O of the canister 30 is coincident with the central axis I of the coupler 260, and the standby position may be a position where the central axis O of the canister 30 is not coincident with the central axis I of the coupler 260. The holder driving part 236b may press the first frame 236a to rotate the first frame 236a in a clockwise or counterclockwise direction. For example, the holder driving part 236b may be a cylinder. The first holder guide 237 may be disposed on the first frame 236a. For example, the first holder guide 237 may be recessed from a top surface of the first frame 236a, and a portion of the holder 238 may coupled to the first holder guide 237. The first holder guide 237 may move the holder 238 in response to the rotational movement of the first frame 236a. The number of the first holder guides 237 may correspond to the number of the holders 238.

The holders 238 may support the canister 30 placed in the second space 233 of the first frame 236a. For example, the holders 238 may support an outer perimeter of the canister 30. Alternatively, the holders 238 may support an outer perimeter of the injection port 32 of the canister 30. Each of the holders 238 may include a roller. When the holders 238 include rollers, the holders 238 may rotate the canister in the second space 233. The holders 238 may include a plurality of rollers 238a, 238b, 238c and 238d. For example, the rollers 238a to 238d may include a driving roller 238a and driven rollers 238b, 238c and 238d. The second holder guides 239 may guide a movement of the holders 238. The number of the second holder guides 239 may correspond to the number of the holders 238. One of the second holder guides 239 may include a linear motor (LM) guide. Each of the second holder guides 239 may move each respective holder 238 toward a center of the first frame 236a or away from the center of the first frame 236a. Although not shown in the figures, a sensor may be disposed at a side of the second base 232. The sensor may, for example, read a barcode recorded on the canister 30. The read barcode may be used to determine the type of chemical solution(s) stored in the canister 30. A method of moving the canister 30 using the rollers 238a to 238d will be described below.

Referring to FIGS. 4 and 5A, the canister 30 may be loaded in the second space 233 of the first frame 236a. At this step, the rollers 238a to 238d may be respectively positioned at corresponding standby positions. As previously stated, the standby position may be a position where the central axis O of the canister 30 is not aligned with the central axis I of the coupler 260. The rollers 238a to 238d may be positioned at a first end of their respective first holder guides 237 at the standby position.

Referring to FIGS. 4 and 5B, the holder driving part 236b may press the first frame 236a to rotate the first frame 236a. Accordingly, the rollers 238a to 238d may shift toward the locking position along the first and second holder guides 237 and 239. As a result, the canister 30 may also be moved with respect to its initial position. As previously stated, the locking position may be a position where the central axis O of the canister 30 is coincident with the central axis I of the coupler 260. The rollers 238a to 238d may be positioned at a second end (e.g., opposite to the first end) of their respective first holder guides 237 at the locking position. Each of the rollers 238a to 238d may be in contact with the outer perimeter of the canister 30 and may move the canister 30 to align the central axis O of the canister 30 with the central axis I of the coupler 260. The second end of the first holder guide 237 may be closer to the second space 233 than the first end of the first holder guide 237. Imaginary lines which indicate movement of the rollers 238a to 238d, in a plane formed along the first and second directions X and Y, may respectively extend toward a center of the second space 233.

Referring to FIGS. 4 and 5C, the driving roller 238a may turn to rotate the canister 30. As the canister 30 is rotated, the driven rollers 238b, 238c and 238d may also turn to assist the rotational movement of the canister 30. The rotationally driven canister 30 may allow the sensor to read a barcode recorded on the canister 30. According to an exemplary embodiment of the present inventive concept, the rollers 238a to 238d are used as the holder 238, but the shape and configuration of the holder 238 are not limited thereto. For example, a gripper may be provided as the holder 238.

Referring back to FIG. 2B, the guide 240 may be disposed at a side of the clamp 230. The guide 240 may extend along the first direction X. The guide 240 may include a second guide rail 240l extending in the first direction X.

The opener 250 may open and close the injection port 32. The opener 250 may include an opener connecting part 252, an opener driving part 254, and an opener guide 256. The opener connecting part 252 may be coupled to the injection port 32 of the canister 30. The opener driving part 254 may press the opener connecting part 252 to couple the opener connecting part 252 with the injection port 32 of the canister 30. For example, the opener driving part 254 may include a pneumatic cylinder. The opener guide 256 may be coupled to the opener driving part 254. The opener guide 256 may move the opener connecting part 252 in the third direction Z. For example, the opener driving part 254 may shift along a third guide rail 256l of the opener guide 256 so that the opener connecting part 252 may shift in the third direction Z. The opener guide 256 may be coupled to the guide 240.

The chemical supply line 280 may connect the substrate treatment unit 10 to the chemical supply unit 20. The chemical supply line 280 may supply the substrate treatment unit 10 with the chemical solution contained in the canister 30.

Figure 6A:
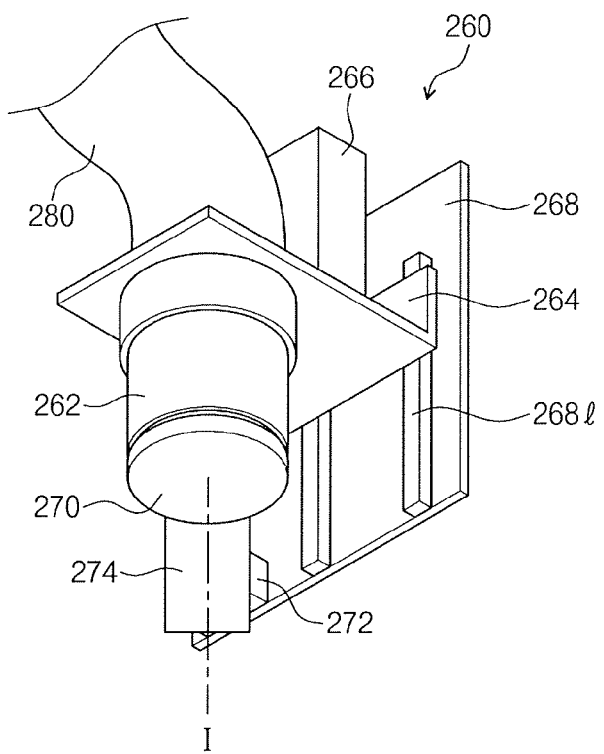
FIG. 6A is a perspective view illustrating a coupler of FIG. 2B according to an exemplary embodiment of the present inventive concept.
Figure 6B:
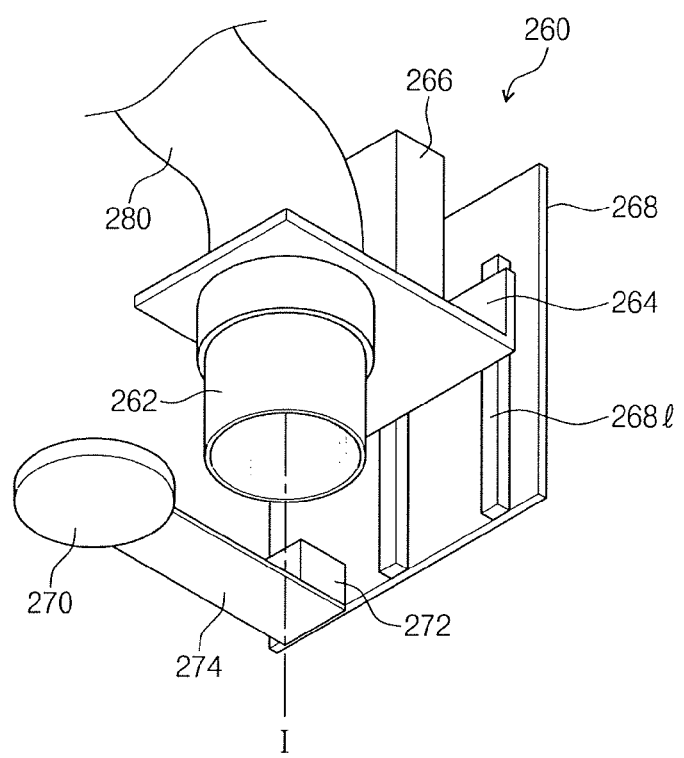
FIG. 6B is a perspective view illustrating the coupler of FIG. 2B according to an exemplary embodiment of the present inventive concept.

FIG. 6A is a perspective view illustrating the coupler 260 of FIG. 2B according to an exemplary embodiment of the present inventive concept. FIG. 6B is a perspective view illustrating the coupler 260 of FIG. 2B according to an exemplary embodiment of the present inventive concept. Referring to FIGS. 2B, 6A and 6B, the coupler 260 may be provided at an end of the chemical supply line 280. The coupler 260 may include a coupler connecting part 262, a third base 264, a coupler driving part 266, a coupler guide 268, a tray 270, a tray driving part 272, and a tray arm 274. The coupler connecting part 262 may be coupled to the injection port 32 of the canister 30. The central axis I of the coupler 260 may be the same as a central axis I of the coupler connecting part 262. The third base 264 may be coupled to the coupler guide 268. The coupler driving part 266 may press the coupler connecting part 262 to couple the coupler connecting part 262 with the injection port 32 of the canister 30. For example, the coupler driving part 266 may include a pneumatic cylinder. The coupler guide 268 may move the coupler connecting part 262 in the third direction Z. For example, the coupler guide 268 may move the coupler connecting part 262 along the central axis I. The coupler connecting part 262 may be moved in the third direction Z along a fourth guide rail 268l of the coupler guide 268. The coupler guide 268 may be coupled to the guide 240. The coupler guide 268 and the opener guide 256 may be disposed on the guide 240 and be positioned side by side with respect to each other.

The tray 270 may be coupled to the coupler guide 268. The tray 270 may have a size corresponding to a size of the coupler connecting part 262. The tray 270 may receive the chemical solution from the chemical supply line 280 and the coupler connecting part 262. The tray 270 may prevent the chemical solution from being drained away from (e.g., outside of) the tray 270. For example, the tray 270 covers the coupler connecting part 262 such that the chemical solution may not leak out of the coupler connecting part 262. The tray driving part 272 may drive the tray 270. For example, the tray driving part 272 may drive the tray 270 between a first position and a second position (e.g., positions which cause the coupler connecting part 262 to be open or closed by the tray 270). The tray arm 274 may connect the tray 270 to the tray driving part 272.

As shown in FIG. 6A, the tray driving part 272 may put the tray 270 in place onto the first position under the coupler connecting part 262. At the first position, the tray 270 may completely overlap the coupler connecting part 262 and receive the chemical solution supplied from the chemical supply line 280 and the coupler connecting part 262. As shown in FIG. 6B, the tray driving part 272 may move the tray 270 onto the second position, the tray 270 being horizontally spaced apart from the coupler connecting part 262. When the tray driving part 272 places the tray 270 at the second position, the coupler connecting part 262 may be coupled to the injection port 32 of the canister 30.

Referring to FIG. 2B, the cleaning port 290 may be installed at a side of the clamp 230. The cleaning port 290 may be coupled to the coupler connecting part 262 to clean the chemical supply line 280 and the coupler connecting part 262. For example, the cleaning port 290 may clean interiors of the chemical supply line 280 and the coupler connecting part 262.

Although not shown in the figures, the substrate treatment apparatus 1 may further include a controller. The controller may control the chemical supply unit 20. For example, the controller may control operations of the loader 220, the clamp 230, the guide 240, the opener 250, the chemical supply line 280, the coupler 260, and the cleaning port 290. In addition, the controller may control a sequence of operation (e.g., an order of operation) between the loader 220, the clamp 230, the guide 240, the opener 250, the chemical supply line 280, the coupler 260, and the cleaning port 290.

FIGS. 7A, 7B, 7C, 7D and 7E are perspective views illustrating the canister 30 being inserted in the chemical supply unit 20 and being connected to the substrate treatment apparatus 1 according to an exemplary embodiment of the present inventive concept.

Figure 7A:
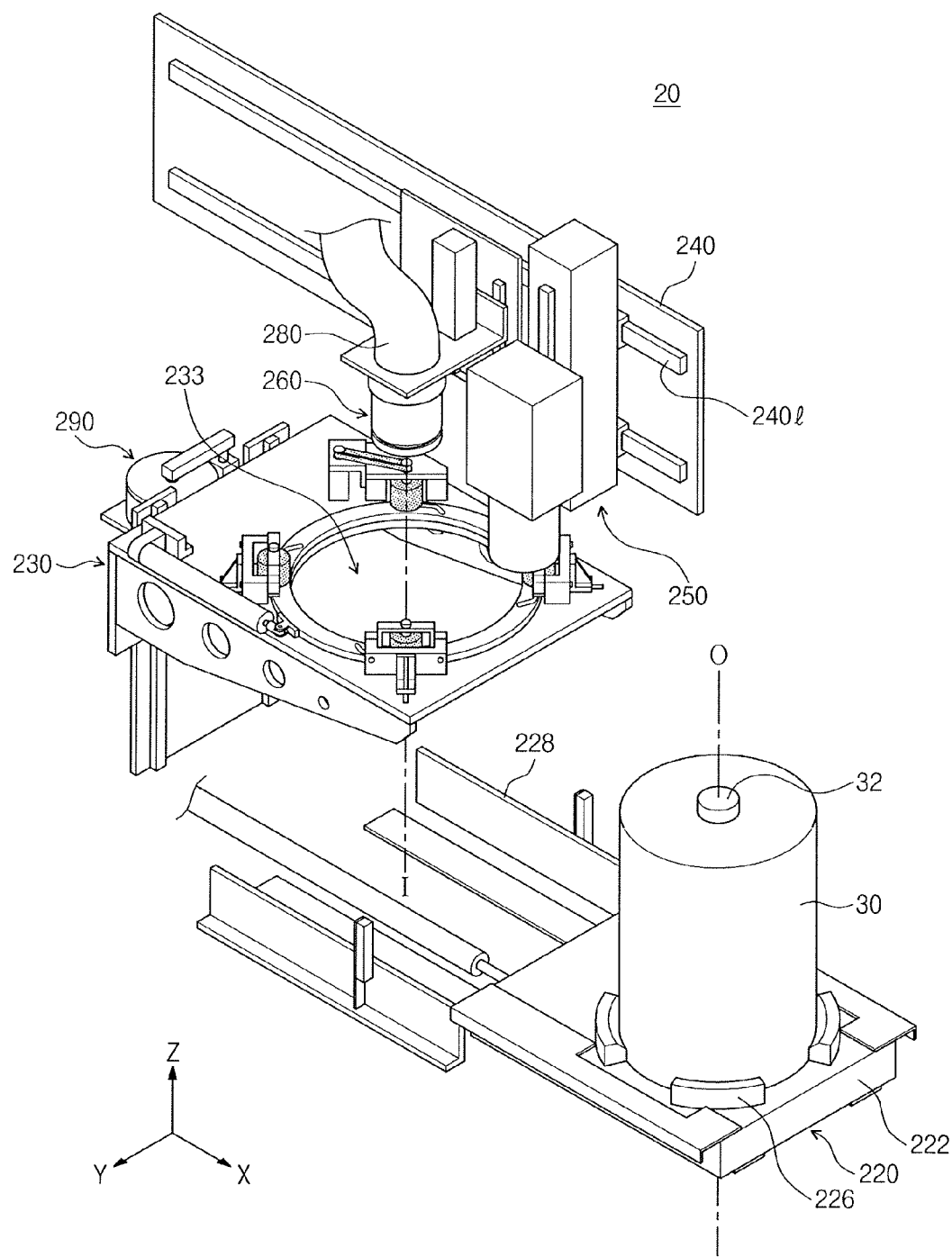
FIGS. 7A, 7B, 7C, 7D and 7E are perspective views illustrating a canister being inserted in the chemical supply unit and being connected to the substrate treatment apparatus according to an exemplary embodiment of the present inventive concept.

Referring to FIG. 7A, the canister 30 may be loaded on the loader 220 when the loader driving part 228 places the first base 222 at the work position. The canister 30 may be loaded on the plate 224 of FIG. 3. The injection port 32 may be disposed at a top end of the canister 30. The injection port 32 may include a cover. The cover may be threaded on the injection port 32 to seal the canister 30, or the cover may be pressed on the injection port 32 to hermetically seal the canister 30. The injection port 32 may be variously configured to have alternative sealing structures that seal the canister 30. Alternatively, the injection port 32 may include a membrane that seals the canister 30. The coupler 260 may have the preset central axis I.

Figure 7B:
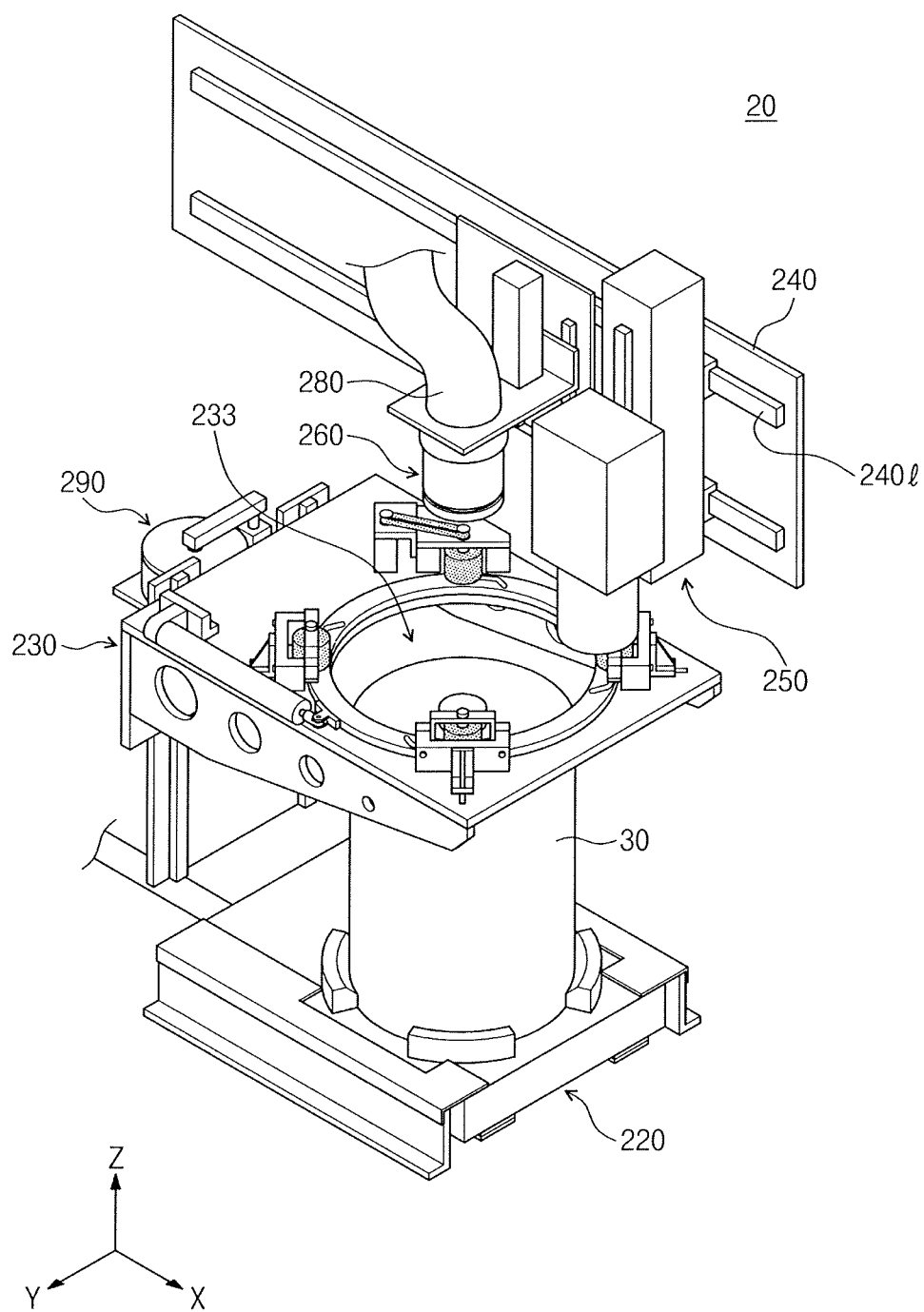
Figure 7C:
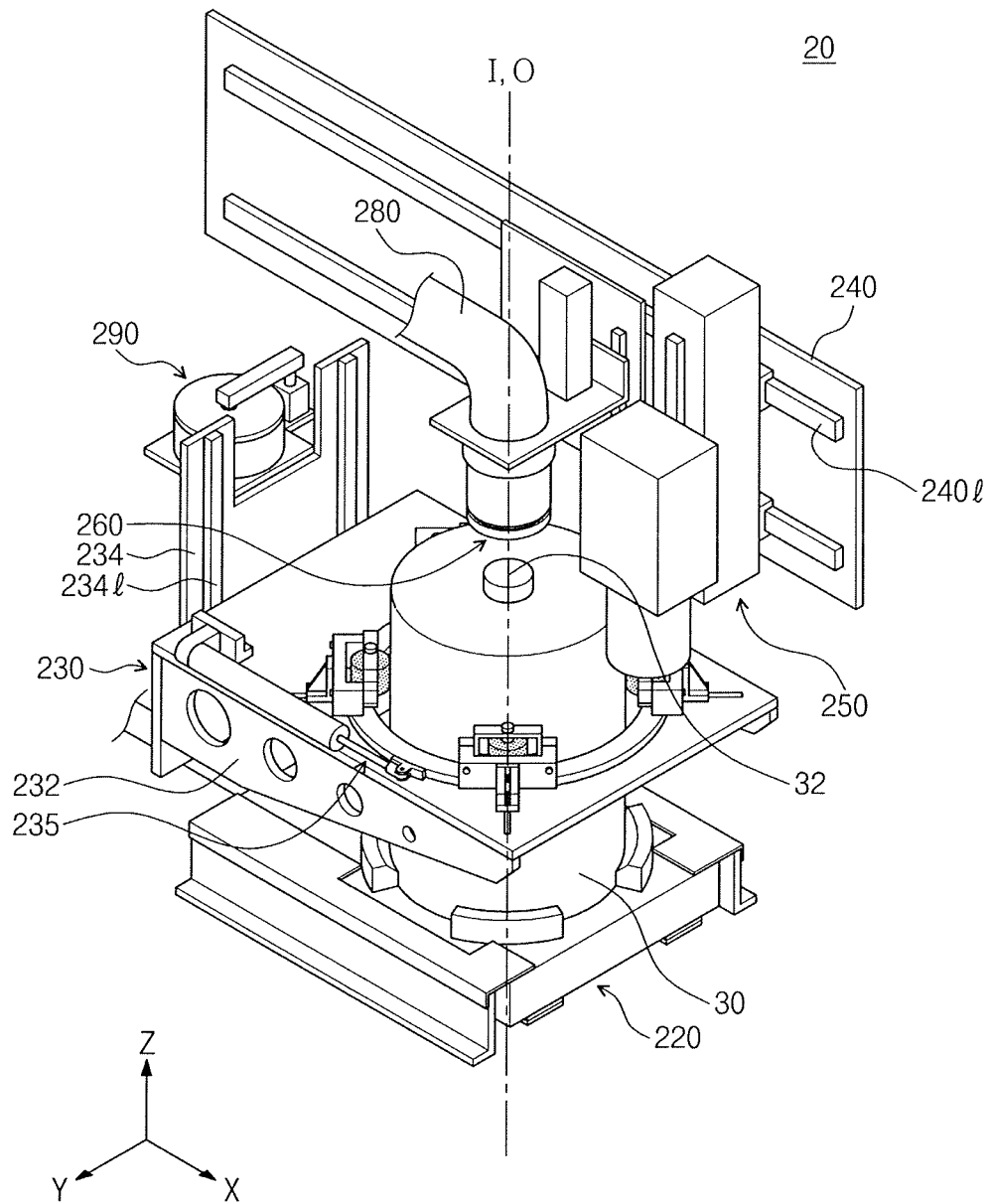

Referring to FIGS. 7B and 7C, the loader driving part 228 may drive the first base 222 into the work position. At the work position, the canister 30 may vertically overlap the second space 233 of the holding member 235. Thereafter, the clamp 230 may fix the canister 30, and the holder driving part 236b may position or align the canister 30 such that the central axis O of the canister 30 is coincident with the axis I of the coupler 260. The clamp guide 234 may move the second base 232 along the third direction Z so that the holders 238 may contact the outer perimeter of the canister 30. When the canister 30 is placed in the second space 233 of the holding member 235, the holder 238 may move into the locking position to support of the outside perimeter of the canister 30. The process of moving the holder 238 into the locking position is the same as that discussed with reference to FIGS. 5A and 5B above. Thus, a repetitive description thereof will be omitted for brevity. Although not shown in the figures, a sensor may be disposed at a side of the clamp 230 to sense the type or kind of the canister 30.

Figure 7D:
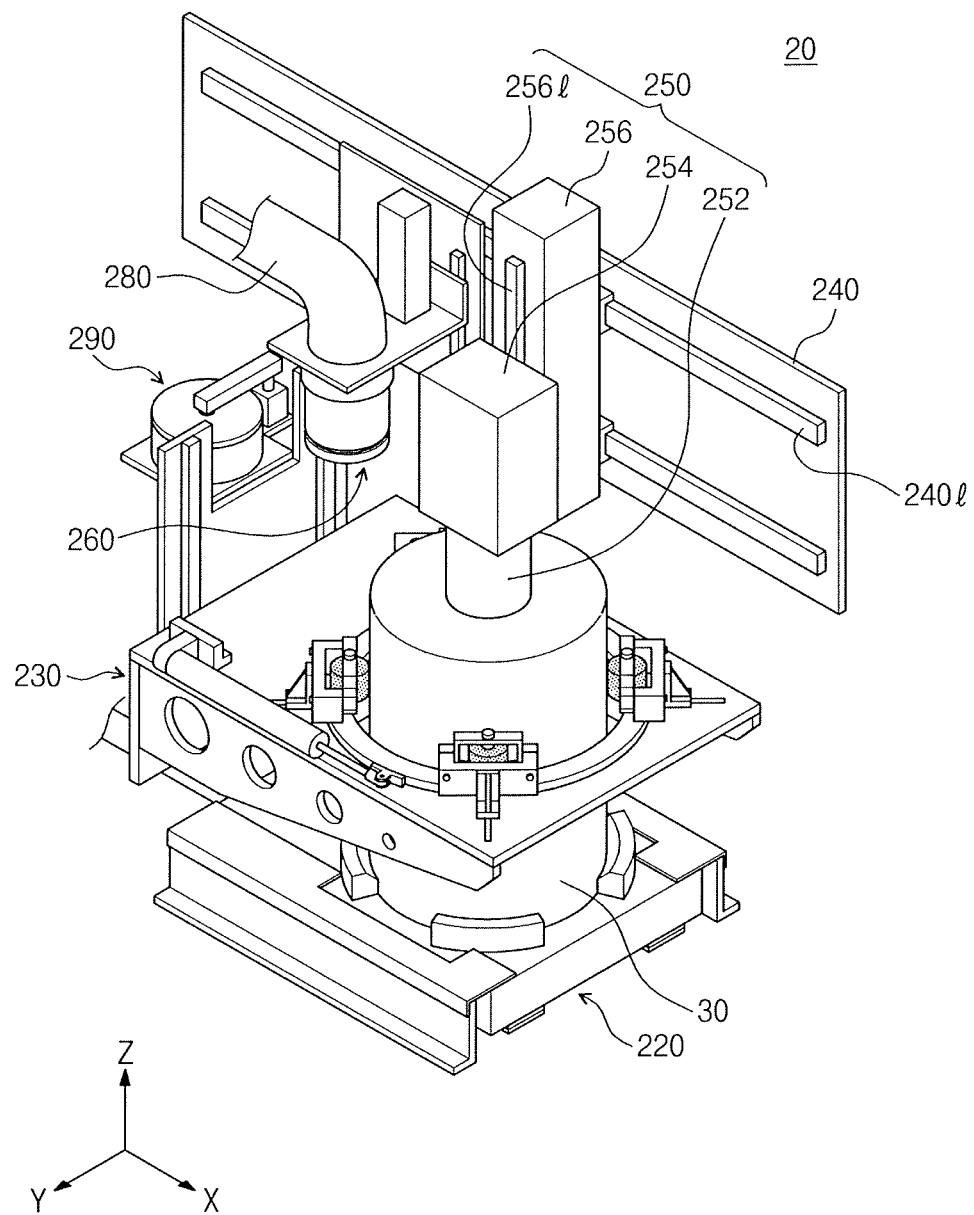

Referring to FIG. 7D, the opener connecting part 252 may be coupled to the injection port 32. For example, the opener guide 256 may move in the first direction X along the guide 240 so the opener connecting part 252 may be coupled to the injection port 32. The opener driving part 254 may move downward along the third guide rail 256*l* when the opener connecting part 252 is placed at a position where the opener connecting part 252 vertically overlaps the injection port 32, e.g., a central axis of the opener connecting part 252 is vertically aligned with the axis (represented by the reference symbol O of FIG. 7C) of the canister 30. Then, the opener driving part 254 may press to couple the opener connecting part 252 to the injection port 32. For example, in case that the injection port 32 includes a threaded cover, the opener connecting part 252 may clamp the cover and the plate 224 of FIG. 3 may rotate the canister 30 to open the injection port 32. Alternatively, in a case in which the injection port 32 includes a membrane, the opener connecting part 252 may be provided to have a shape and/or a material capable of penetrating the membrane. Alternatively, in a case in which the injection port 32 includes a cover that is pressed on the injection port 32, the opener driving part 254 may drive the opener connecting part 252 in the third direction Z to open the cover injection port 32.

Figure 7E:
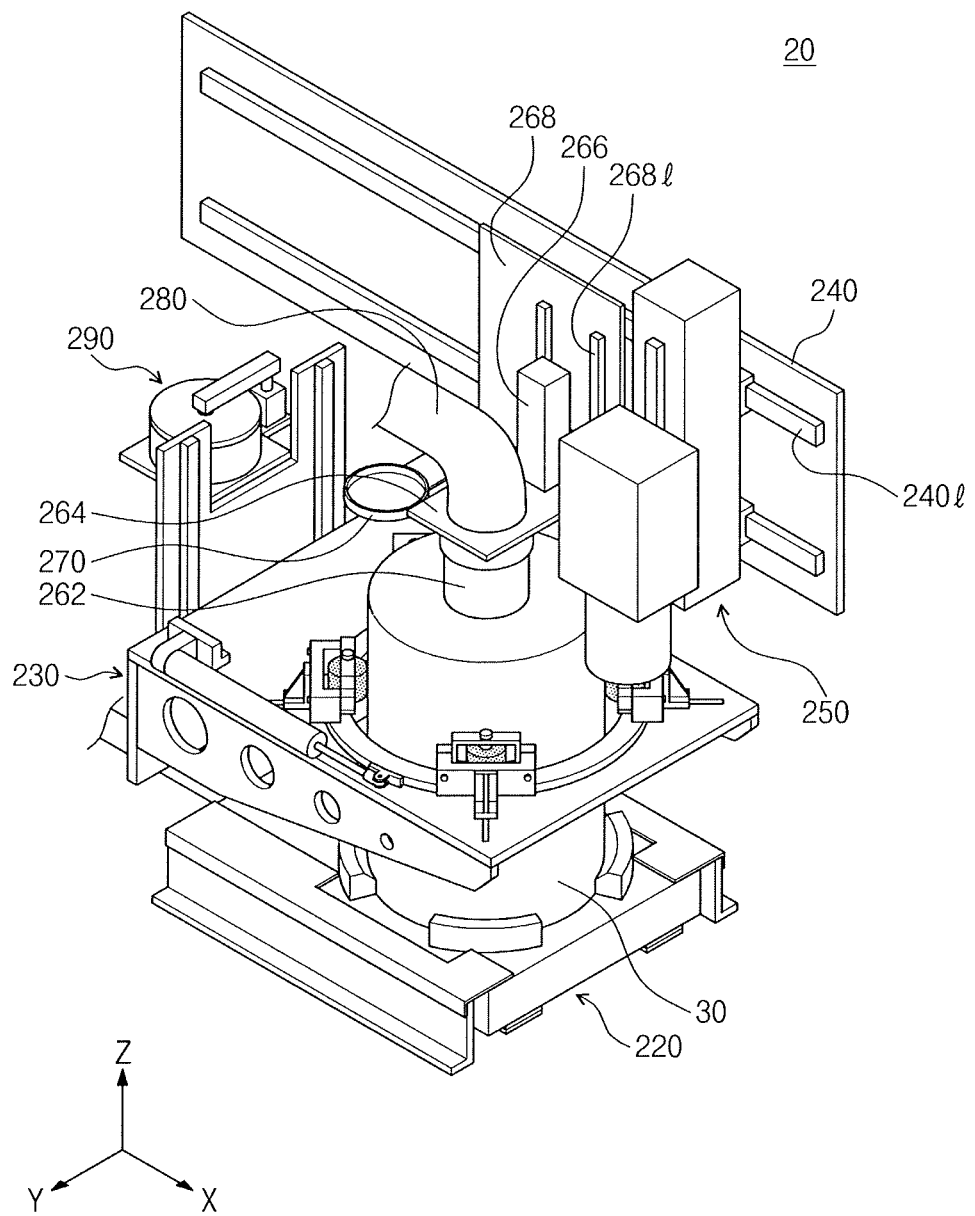

Referring to FIG. 7E, the coupler 260 may be coupled to the injection port 32 that is opened by the opener connecting part 252. For example, to couple the coupler 260 with the injection port 32, the coupler guide 268 may move in the first direction X along the guide 240 to align the coupler connecting part 262 with the injection port 32. The third base 264 may move downward along the fourth guide rail 268*l* when the coupler connecting part 262 is placed at a position where the coupler connecting part 262 vertically overlaps the injection port 32, e.g., the central axis I of the coupler 260 is vertically aligned with the axis O of the canister 30. Thereafter, the coupler driving part 266 may press the coupler connecting part 262 to couple the coupler connecting part 262 with the injection port 32. Before the coupler connecting part 262 is coupled to the injection port 32, the tray 270 may move from the first position under the coupler connecting part 262 toward the second position to create an open access to the coupler connecting part 262. The tray 270 may be placed at the first position except for when the coupler connecting part 262 is coupled to the injection port 32. Thus, an outflow of the chemical solution in the chemical supply line 280 and the coupler connecting part 262 may be prevented. The chemical supply line 280 may be supplied with the chemical solution contained in the canister 30 when the coupler connecting part 262 is coupled to the injection port 32. The chemical supply line 280 may supply the chemical solution to the slit nozzle 130 of the substrate treatment unit 10.

After supplying the chemical solution, a cleaning process may be performed to clean the coupler 260 and the chemical supply line 280. For example, the coupler guide 268 may move along the guide 240 and the coupler connecting part 262 may be coupled to the cleaning port 290. The cleaning port 290 may clean the interior of the coupler connecting part 262 and the chemical supply line 280. For example, the cleaning port 290 may supply an etchant to clean the coupler connecting part 262 and the chemical supply line 280.

According to an exemplary embodiment of the present inventive concept, the chemical solution may be automatically replaced and supplied when needed. Accordingly, an unmanned and automatic system may be implemented to feed the substrate treatment apparatus 1 with the chemical solution. As a result of the unmanned and automatic feeding system, environmental pollution from spilled chemicals may be reduced and exposure of operators to the chemical(s) used by the substrate treatment apparatus 1 may be reduced.

Figure 8:
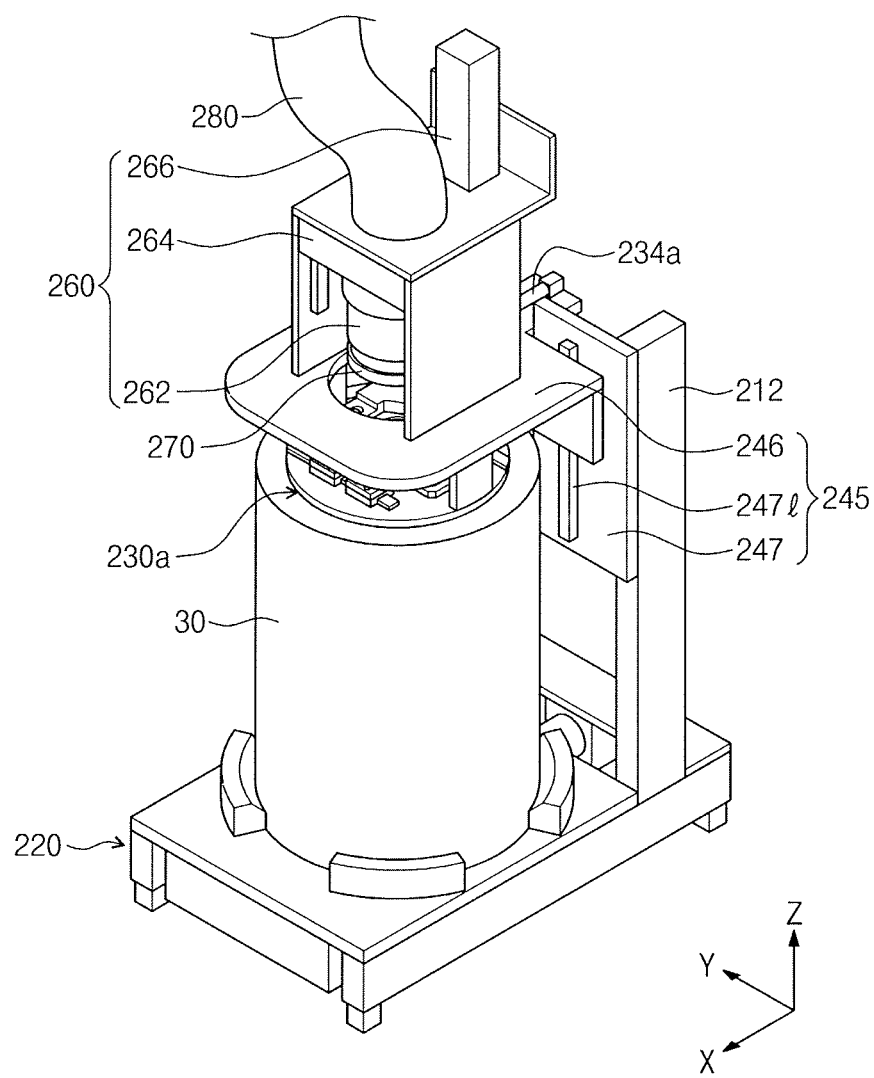
FIG. 8 is a perspective view illustrating a chemical supply unit according to an exemplary embodiment of the present inventive concept.

FIG. 8 is a perspective view illustrating a chemical supply unit 20a of the substrate treatment apparatus 1 according to an exemplary embodiment of the present inventive concept. Referring to FIG. 8, the chemical supply unit 20a may include a main frame 212, a loader 220, a clamp 230a, a sub-frame 245, a coupler 260, and a chemical supply line 280. Description of elements previously described may be omitted for brevity. The main frame 212 may connect the loader 220 to the sub-frame 245.

Figure 9A:
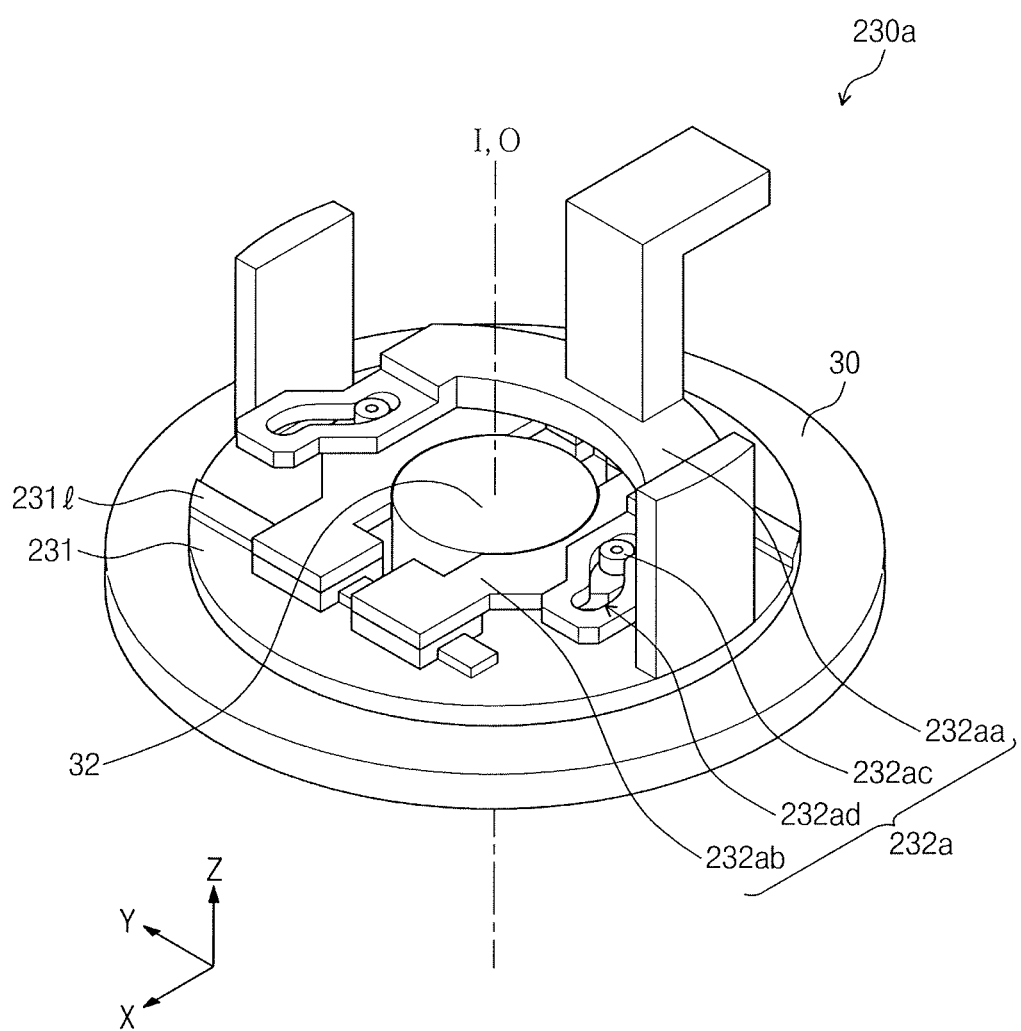
FIG. 9A is a perspective view illustrating a clamp of FIG. 8 according to an exemplary embodiment of the present inventive concept.
Figure 9B:
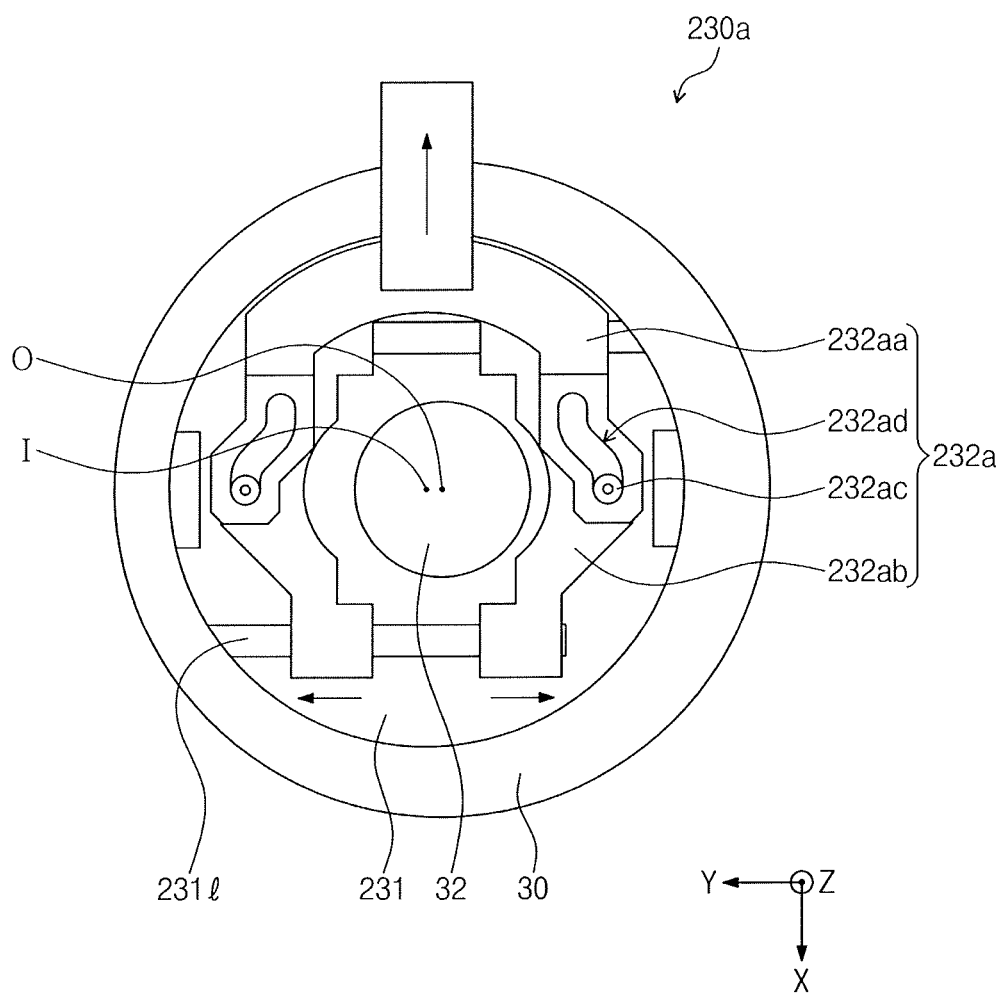
FIGS. 9B and 9C are plan views illustrating a clamping movement of the clamp of FIG. 8 according to an exemplary embodiment of the present inventive concept.
Figure 9C:
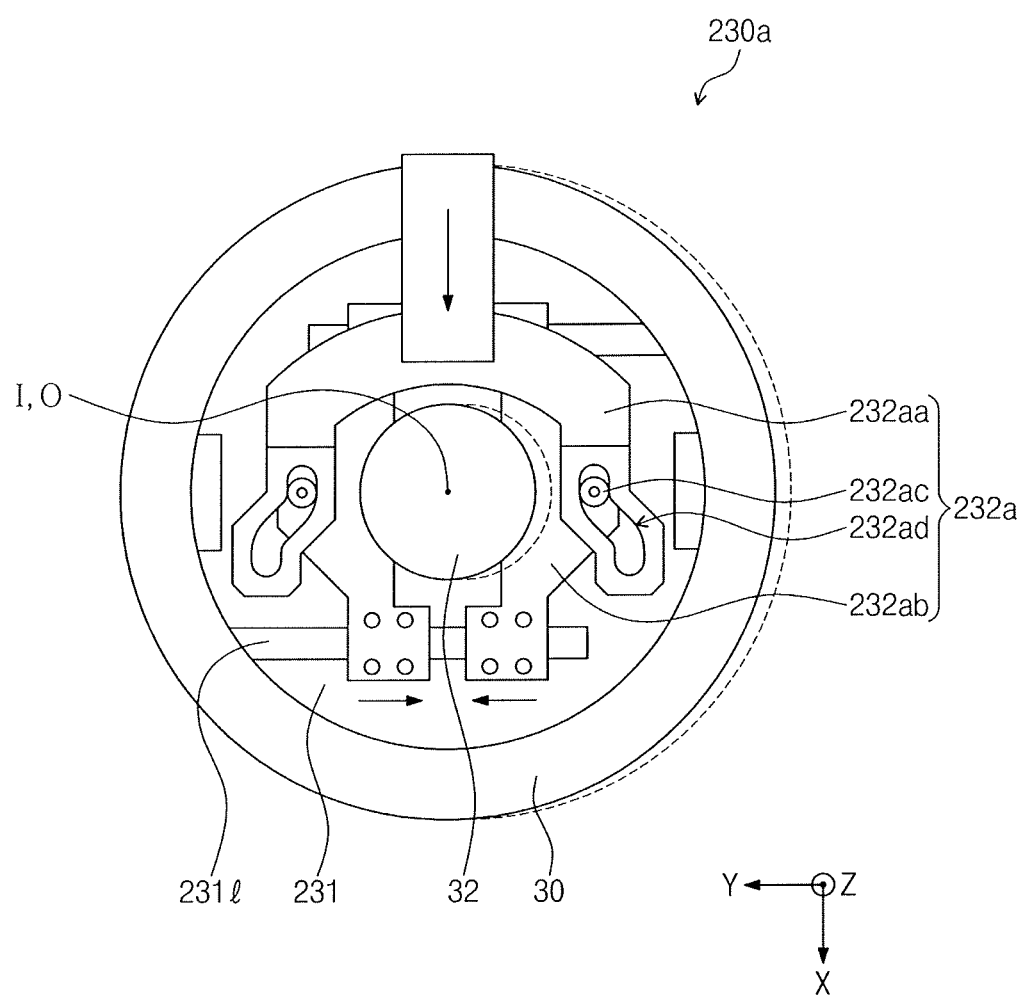

FIG. 9A is a perspective view illustrating the clamp 230a of FIG. 8 according to an exemplary embodiment of the present inventive concept. FIGS. 9B and 9C are plan views illustrating a clamping movement of the clamp 230a of FIG. 8 according to an exemplary embodiment of the present inventive concept. The clamping movement illustrated in FIGS. 9B and 9C may be used to clamp the canister 30. The clamp 230a will be hereinafter discussed with reference to FIGS. 8 to 9C. The clamp 230a may include a fourth base 231, a holder 232a, and a holder driving part 234a. The fourth base 231 may be coupled with a side of the sub-frame 245. The fourth base 231 may move in the third direction Z while being coupled to a third frame 247 of the sub-frame 245. For example, the fourth base 231 may shift in the third direction Z along a fifth guide rail 247l. At least a portion of the holder 232a may be coupled to the fourth base 231. For example, a second body 232ab of the holder 232a may be coupled to a sixth guide rail 231l of the fourth base 231. The holder 232a may clamp the canister 30. For example, the holder 232a may clamp a side of the injection port 32 of the canister 30.

The holder 232a may include a first body 232aa, a cam follower 232ac, a cam follower guide 232ad and the second body 232ab. The first and second bodies 232aa and 232ab may be coupled to each other using the cam follower 232ac. The second body 232ab may include a pair of arms spaced apart from each other, and each of the pair of arms may be coupled to the first body 232aa. The cam follower 232ac may shift along the cam follower guide 232ad.

The holder driving part 234a may press the holder 232a to drive the holder 232a. For example, the holder driving part 234a may press the holder 232a to drive the holder 232a between a standby position and a locking position. Referring to FIG. 9B, when the holder 232a is positioned at the standby position, the central axis O of the canister 30 might not be aligned with the central axis I of the coupler 260. The holder driving part 234a may pull the first body 232aa in a direction (e.g., a negative first direction X, or −X) opposite to the first direction X to place the cam follower 232ac onto a first end of the cam follower guide 232ad. Thus, the second body 232ab may spread its arms apart and release the injection port 32. Referring to FIG. 9C, the holder driving part 234a may drive to place the holder 232a into the locking position. When the holder driving part 234a pushes the first body 232aa in the first direction X, the cam follower 232ac may shift into a second end (e.g., opposite to the first end) of the follower guide 232ad. Thus, the second body 232ab may close its arms to grip the injection port 32. The injection port 32 may be disposed closer to the second end of the cam follower guide 232ad than to the first end of the cam follower guide 232ad. When the holder 232a is positioned at the locking position, the canister 30 may be aligned such that the central axis O of the canister 30 is coincident with the central axis I of the coupler 260.

Referring back to FIG. 8, the sub-frame 245 may further include a second frame 246 in addition to the third frame 247. The second and third frames 246 and 247 may be coupled to each other. The second frame 246 may connect the clamp 230a to the coupler 260. The second frame 246 may be coupled to portions of the clamp 230a and the coupler 260. The third frame 247 may include the fifth guide rail 247l and may move the second frame 246 along the third direction Z. The sub-frame 245 may simultaneously move the clamp 230a and the coupler 260 along the third direction Z.

Although according to an exemplary embodiment of the present inventive concept, with reference to FIGS. 8, and 9A to 9C, the clamp 230a is shown as directly gripping and supporting the injection port 32 of the canister 30, the present inventive concept is not limited thereto. For example, according to an exemplary embodiment of the present inventive concept, with reference to FIG. 2B, a clamp of the chemical supply unit 20 may directly grip and support an outside perimeter of the injection port 32, like the clamp 230 of FIG. 2B. The chemical supply unit 20a of FIG. 8 may include an opener and a guide that are different from the opener 250 and the guide 240 of the chemical supply unit 20 of FIG. 2B. In addition, the chemical supply unit 20a may include the clamp 230a and the coupler 260 that may be coupled to each other. The clamp 230a and the coupler 260 may move in a single direction. For example, the clamp 230a and the coupler 260 may move along the third direction Z. Due to the configuration and limited movement of the chemical supply unit 20a, an area occupied by the chemical supply unit 20a may be smaller than an area occupied by the chemical supply unit 20.

According to an exemplary embodiment of the present inventive concept, a substrate treatment apparatus may include a chemical supply unit capable of automatically replacing and supplying a chemical solution used by the substrate treatment apparatus.

While the present inventive concept has been particularly shown and described with reference to exemplary embodiments thereof, it will be apparent to those of ordinary skill in the art that various changes in form and detail may be made therein without departing from the spirit and scope of the present inventive concept.

What is claimed is:
1. A substrate treatment apparatus, comprising:
a substrate treatment unit configured to provide a chemical solution to a substrate to treat the substrate;
a chemical supply unit configured to supply the chemical solution to the substrate treatment unit,
wherein the chemical supply unit comprises:
a loader configured to load a canister containing the chemical solution to the chemical supply unit;
a clamp configured to clamp the canister in place;

a chemical supply line through which the chemical solution is supplied to the substrate treatment unit; and
a coupler configured to couple the chemical supply line to the canister;
a holder configured to hold the canister;
a holder driving part configured to move the holder,
wherein the holder driving part is configured to move the holder to a locking position and to a standby position, wherein a central axis of the canister is coincident with a central axis of the coupler in the locking position, and the central axis of the canister is not coincident with the central axis of the coupler in the standby position,
wherein the coupler comprises:
a coupler connecting part configured to be connected to an injection port of the canister; and
a coupler driving part configured to move the coupler connecting part in a first direction,
wherein the coupler is coupled to the clamp,
wherein the chemical supply unit further comprises an opener configured to open the injection port of the canister,
wherein the opener comprises:
an opener connecting part configured to be connected to the injection port of the canister; and
an opener driving part configured to move the opener connecting part in the first direction.

2. The apparatus of claim 1, wherein the coupler is coupled to the clamp.

3. The apparatus of claim 1, wherein the opener is disposed adjacent to a side of the coupler.

4. The apparatus of claim 1, wherein the chemical supply unit further comprises a guide extending in a second direction that crosses the first direction,
wherein the coupler and the opener are coupled to the guide.

5. A substrate treatment apparatus, comprising:
a substrate treatment unit configured to provide a chemical solution to a substrate to treat the substrate;
a chemical supply unit configured to supply the chemical solution to the substrate treatment unit,
wherein the chemical supply unit comprises:
a loader configured to load a canister containing the chemical solution to the chemical supply unit;
a clamp configured to clamp the canister in place;
a chemical supply line through which the chemical solution is supplied to the substrate treatment unit; and
a coupler configured to couple the chemical supply line to the canister;
a holder configured to hold the canister; and
a holder driving part configured to move the holder,
wherein the holder driving part is configured to move the holder to a locking position and to a standby position, wherein a central axis of the canister is coincident with a central axis of the coupler in the locking position, and the central axis of the canister is not coincident with the central axis of the coupler in the standby position,
wherein the coupler comprises:
a coupler connecting part configured to be connected to an injection port of the canister; and
a coupler driving part configured to move the coupler connecting part in a first direction,
wherein the coupler further comprises a tray configured to move to a first position and to a second position, wherein the tray closes an opening of the coupler connecting part to prevent the chemical solution disposed inside of the chemical supply line from being drained through the opening of the coupler connecting part when the tray is disposed in the first position, and the tray exposes the coupler connecting part when the tray is disposed in the second position.

6. The apparatus of claim 1, wherein the coupler is disposed at an end of the chemical supply line.

7. The apparatus of claim 1, wherein the loader comprises a plate configured to carry and rotate the canister.

8. The apparatus of claim 1, wherein the chemical solution includes a photoresist.

* * * * *